(12) United States Patent
Nowodzinski

(10) Patent No.: US 10,651,791 B2
(45) Date of Patent: May 12, 2020

(54) METHOD FOR DETERMINING CHARACTERISTIC PARAMETERS OF AN OSCILLATOR

(71) Applicant: COMMISSARIAT A L'ENERGIE ATOMIQUE ET AUX ENERGIES ALTERNATIVES, Paris (FR)

(72) Inventor: Antoine Nowodzinski, Saint-Joseph-de-Rivière (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 41 days.

(21) Appl. No.: 16/146,174

(22) Filed: Sep. 28, 2018

(65) Prior Publication Data

US 2019/0097579 A1    Mar. 28, 2019

(30) Foreign Application Priority Data

Sep. 28, 2017   (FR) ..................... 17 59010

(51) Int. Cl.
| | | |
|---|---|---|
| *H03B 5/30* | (2006.01) | |
| *G01N 29/036* | (2006.01) | |
| *G01N 29/30* | (2006.01) | |
| *G01R 23/16* | (2006.01) | |
| *G01R 31/317* | (2006.01) | |
| *G01R 23/00* | (2006.01) | |

(52) U.S. Cl.
CPC ............ *H03B 5/30* (2013.01); *G01N 29/036* (2013.01); *G01N 29/30* (2013.01); *G01R 23/00* (2013.01); *G01R 23/16* (2013.01); *G01R 31/31702* (2013.01)

(58) Field of Classification Search
CPC .. G01R 23/00; G01R 23/16; G01R 31/31702; H03B 5/30; G01N 29/036; G01N 29/30
See application file for complete search history.

(56) References Cited

U.S. PATENT DOCUMENTS

| | | | |
|---|---|---|---|
| 8,686,802 B1 | 4/2014 | Brown et al. | |
| 10,309,782 B2 * | 6/2019 | Kapusta | ............. G01C 19/5776 |
| 2019/0095779 A1 * | 3/2019 | Leobandung | ........ G06N 3/0445 |

OTHER PUBLICATIONS

Search Report as issued in French Patent Application No. 1759010, dated Jul. 16, 2018.

(Continued)

*Primary Examiner* — Jeffrey M Shin
(74) *Attorney, Agent, or Firm* — Pillsbury Winthrop Shaw Pittman LLP

(57) ABSTRACT

A method for determining characteristic parameters of an electrostatic actuation oscillator, where the method includes generating a first excitation voltage defined as being the sum of a first sinusoidal voltage and a voltage pulse; applying the first excitation voltage at the input of the oscillator; acquiring in the time domain a first response voltage present at the output of the oscillator when the first excitation voltage is applied at the input of the oscillator; obtaining, by transformation in the frequency domain, a first amplitude spectral density of the first response voltage; determining the characteristic parameters of the oscillator from the first amplitude spectral density.

6 Claims, 4 Drawing Sheets

(56) References Cited

OTHER PUBLICATIONS

Zhang, W.-M., et al., "Nonlinear Dynamic Analysis of Electrostatically Actuated Resonant MEMS Sensors Under Parametric Excitation," IEEE Sensors Journal, vol. 7, No. 3, Mar. 2007, XP011163489, p. 370-380.

Nayfeh, A. H., et al., "Dynamics of MEMS resonators under superharmonic and subharmonic excitations," Institute of Physics Publishing, Journal of Micromechanics and Microengineering, vol. 15, No. 10, Oct. 2005, XP020091372, pp. 1840-1847.

Ouakad, H. M., et al., "The dynamic behavior of MEMS arch resonators actuated electrically," International Journal of Non-Linear Mechanics, vol. 45, No. 7, Sep. 2010, XP055415795, pp. 704-713.

\* cited by examiner

METHOD FOR DETERMINING CHARACTERISTIC PARAMETERS OF AN OSCILLATOR

CROSS-REFERENCE TO RELATED APPLICATIONS

This application claims priority to French Patent Application No. 1759010, filed Sep. 28, 2017, the entire content of which is incorporated herein by reference in its entirety.

TECHNICAL FIELD OF THE INVENTION

The present invention concerns a method for determining characteristic parameters of an oscillator, such as the resonant frequency and the quality factor.

TECHNOLOGICAL BACKGROUND OF THE INVENTION

An electrostatic actuation oscillator of the electromechanical microsystem or nanosystem type, respectively MEMS ("microelectromechanical system") or NEMS ("nanoelectromechanical system"), is a device including a mobile component which can be set to oscillate.

Such oscillators consume little energy and have a reduced size. They therefore have particularly advantageous applications in roaming objects, such as smartphones or digital tablets. These oscillators are used in particular to manufacture inertial sensors, such as accelerometers or gyroscopes, intended to be fitted into such objects.

A roaming object can also be fitted with a satellite location system (GPS for "Global Positioning System") which consumes a lot of energy. Inertial sensors enable the movements of the object to be computed in real time, and therefore enable use of the satellite location system to be reduced. This latter system nonetheless remains useful for determining a reference position of the object, for example at regular time intervals.

The electrostatic actuation oscillator contains actuation means which transform an excitation signal applied at the input of the oscillator into an electrostatic actuation force, also called an "excitation force", acting on the mobile component. The movements of the mobile component are measured by detection means which generate a response signal at the output of the oscillator. The excitation signal and the response signal can take the form, for example, of voltages.

The oscillator is characterised by two essential parameters, namely a resonant frequency and a quality factor. The oscillations of the mobile component are indeed governed by motion equations which are modified when an external force, for example due to acceleration or a gyroscopic effect, is exerted on the mobile component. The resonant frequency is then also modified. If the oscillator's initial resonant frequency is known, it is therefore possible to quantify the applied external force.

It is also preferable to excite the oscillator to a frequency close to the resonant frequency so as to maximise the amplitude of the oscillations. By this means the force being exerted on the mobile component can be detected more easily, and the sensor's sensitivity is improved.

The oscillator's quality factor, for its part, influences the accuracy of the inertial sensor. The higher the quality factor the more accurate the sensor, and the more it is possible, for example, to limit use of the satellite location system.

It is therefore important to measure the oscillator's resonant frequency and quality factor, in particular to validate the development and manufacture of the inertial sensor.

A first method of measuring the resonant frequency and quality factor consists in exciting the oscillator by means of a sinusoidal excitation voltage of frequency $F_0$ and in measuring the amplitude of the oscillations at frequency $2F_0$. The amplitude of the oscillations is measured at frequency $2F_0$ since the electrostatic actuation force is proportional to the square of the excitation voltage. By sweeping a frequency range an amplitude spectral density of the oscillations is obtained, from which the resonant frequency can be determined. Indeed, the amplitude spectral density forms a resonance peak with a maximum amplitude attained at the resonant frequency. The quality factor can, for its part, be determined from the breadth of the resonance peak considered at half its height.

One disadvantage of this method of measuring by frequency sweep is that in order to measure the amplitude of the oscillations correctly the oscillator must return to an idle position between two successive measurements. The time required for the oscillator to return to its idle position after excitation is approximately equal to three times a damping constant which is proportional to the quality factor. If one considers, for example, a quality factor of the order of $10^6$, the damping constant is of the order of 10 seconds. In this case over 2 hours are required to acquire 250 measuring points.

Furthermore, the accuracy with which the resonance peak is defined also depends on the number of measuring points. If the number of points is not sufficient, the resonance peak can be broadened artificially and its maximum amplitude can be frequency shifted, which distorts the measurement of the resonant frequency and of the quality factor.

The time required to implement this measuring method is therefore a factor which limits productivity, particularly since the current trend is to increase the quality factor of oscillators. This measuring time does not reasonably enable, in particular from an industrial standpoint, to characterize all the oscillators of a silicon plate, which habitually contains over one hundred of them. Only a few oscillators are then characterized, which makes it difficult to estimate an oscillator manufacturing yield.

A second method of measuring the resonant frequency and the quality factor, called the "broadband pulse" method, consists in exciting the oscillator by means of a voltage pulse and in acquiring the response signal generated by the oscillator. Indeed, a pulse in the time domain corresponds to a constant amplitude in the frequency domain. In practice the pulse tends to have a high spectral bandwidth. Consequently, by calculating the Fourier transform of the acquired signal, it is possible to locate the resonance peak present in the pulse's spectral band. This is a rapid measuring method since the acquisition can last only a few seconds.

Using this method, the acquisition duration directly determines the frequency resolution of the measurement. For example, an acquisition duration of 1 second gives a resolution of 1 Hertz, and an acquisition duration of 100 seconds gives a resolution of 0.01 Hertz.

One disadvantage of this measuring method by broadband pulse is that the electrostatic actuation oscillator has a parasitic capacity between the actuation means and the detection means. There is therefore direct electrical coupling of the excitation voltage towards the oscillator's output. Since the excitation voltage is broadband its amplitude spectral density is then superimposed on the amplitude spectral density of the response signal. If the capacitive coupling is sufficiently large a weak oscillation of the oscillator is then immersed in the spectrum of the excitation voltage, which generally makes this measuring method unusable.

To overcome this problem, instead of a broadband pulse it is possible to use a narrowband pulse to excite the oscillator. This narrowband pulse is shaped, for example, like a cardinal sine function of spectral width $\Delta F$ modulated by a sine function of frequency $F_0$. Excitation voltage u(t) can then be defined by the following equation:

$$u(t) = \text{sinc}(\Delta F \cdot t) \cdot \sin(2 \cdot \pi \cdot F_0 \cdot t) \quad (1)$$

The excitation force is proportional to the square of excitation voltage u(t) and can be expressed by the following equation:

$$F(t) = k \cdot [\text{sinc}(\Delta F \cdot t) \cdot \sin(2 \cdot \pi \cdot F_0 \cdot t)]^2 \quad (2)$$

where k is a proportionality factor. Equation (2) can be developed to obtain the following equation:

$$F(t) = k[\tfrac{1}{2} \cdot \text{sinc}^2(\Delta F \cdot t) - \tfrac{1}{2} \cdot \cos(4 \cdot \pi \cdot F_0 \cdot t) \cdot \text{sinc}^2(\Delta F \cdot t)] \quad (2')$$

The excitation force is therefore the sum of a first term proportional to the square of the cardinal sine and of a second term proportional to the square of the cardinal sine modulated at frequency $2F_0$.

FIG. 1 shows the amplitude spectral density (DSA) 110 of the excitation voltage u(t). This spectral density 110 is a rectangle function of breadth $\Delta F$ centred on frequency $F_0$. FIG. 1 also shows the amplitude spectral density of excitation force F(t) which includes a first component 121 and a second component 122 corresponding respectively to the first term and the second term of equation (2'). Each of these spectral components 121, 122 has a triangular shape of width $2\Delta F$, where first component 121 is centred on 0 Hz and second component 122 is centred on $2F_0$.

The resonant frequency of the oscillator is sought in a zone which corresponds to the frequency range over which second component 122 extends. By appropriately defining frequency $F_0$ of the sine and spectral width $\Delta F$ of the cardinal sine, the amplitude spectral density 110 of the exciting pulse transmitted by capacitive coupling is not superimposed with the amplitude spectral density of the electrostatic actuation force, as illustrated in FIG. 1. Thus, the amplitude spectral density resulting from the capacitive coupling of the exciting pulse is not present in the zone where the resonant frequency is sought.

One disadvantage of this measuring method by narrowband pulse is that the amplitude spectral density of the excitation force is not constant. It is, indeed, at a maximum at frequency $2F_0$, and decreases linearly on both sides, until it is cancelled at frequency $2F_0 - 2\Delta F$ and at frequency $2F_0 + 2\Delta F$. The oscillator is therefore excited with a force which depends on the difference between the resonant frequency and frequency $2F_0$. This phenomenon is shown in FIGS. 2A and 2B.

FIG. 2A shows three examples of amplitude spectral densities 211, 212, 213 of the excitation force when frequency $F_0$ is equal respectively to 16.25 kHz, 16.5 kHz and 17.5 kHz. The resonant frequency of the oscillator is sought in the frequency window formed by each of these spectral densities To each of spectral densities 211, 212, 213 of the excitation force corresponds an amplitude spectral density 221, 222, 223 of the response signal acquired at the output of the oscillator.

FIG. 2B is an enlargement of FIG. 2A around the resonance peak. It can be observed that the closer this peak is to the edge of the frequency window the lower its amplitude.

The shape of the amplitude spectral density of the electrostatic force can therefore lead to conclude that the oscillator is not functional, when it is only that the excitation force is too weak to cause the oscillator's mobile component to start oscillating.

SUMMARY OF THE INVENTION

It follows from the foregoing that there is a need to have a method which is at same time fast and reliable to determine the characteristic parameters of an electrostatic actuation oscillator.

To meet this need, a first aspect of the invention relates to a method for determining characteristic parameters of an electrostatic actuation oscillator, where the method includes the following steps:
  generate a first excitation voltage defined as being the sum of a first sinusoidal voltage and a voltage pulse;
  apply the first excitation voltage at the input of the oscillator;
  acquire in the time domain a first response voltage present at the output of the oscillator when the first excitation voltage is applied at the input of the oscillator;
  obtain, by transformation in the frequency domain, a first amplitude spectral density of the first response voltage;
  determine the characteristic parameters of the oscillator from the first amplitude spectral density.

By virtue of the invention, the oscillator is rapidly characterized by obtaining a complete spectral oscillation density by making a single acquisition of the response signal, where this acquisition lasts for several seconds. In this case it is not necessary to excite the oscillator for each frequency of the spectral density, nor to wait for the oscillator to return to an idle position between two points of the spectral density. In addition, use of the sum of a sinusoidal voltage and a voltage pulse to excite the oscillator enables an electrostatic actuation force with a constant amplitude spectral density to be obtained. The time record must contain, at minimum, a portion of the main lobe of the pulse excitation, and preferentially the entire duration of the pulse excitation.

The oscillator's characteristic parameters include a resonant frequency. According to an embodiment, the method includes the following initial steps:
  estimate the oscillator's resonant frequency;
  define a frequency range, called the "search zone", in which the resonant frequency is sought, where the search zone is centred on a median frequency equal to the estimated resonant frequency, and where the search zone has a predetermined width.

One advantage is that the frequency range over which it is desired to search for the resonant frequency in order to configure the excitation voltage appropriately is known.

According to an embodiment, the voltage pulse is a finite pulse response of a low-pass filter.

According to an embodiment, the voltage pulse has a spectral width equal to the width of the search zone, where the first sinusoidal voltage has a first frequency equal to the median frequency. One advantage is that the amplitude spectral density of the electrostatic force is made to coincide with the search zone of the resonant frequency.

According to an embodiment, the voltage pulse has the shape of a cardinal sine function.

According to one implementation the voltage pulse is a finite pulse response of a band-pass filter, where the method also includes the following steps:

generate a second excitation voltage defined as being the sum of a second sinusoidal voltage and the voltage pulse;

apply the second excitation voltage at the input of the oscillator;

acquire in the time domain a second response voltage present at the output of the oscillator when the second excitation voltage is applied at the input of the oscillator;

obtain, by transformation in the frequency domain, a second amplitude spectral density of the second response voltage;

reconstitute an amplitude spectral density from the first amplitude spectral density and the second amplitude spectral density;

where the characteristic parameters of the oscillator are determined from the reconstituted amplitude spectral density. One advantage is that the amplitude spectral density of the sinusoidal voltage transmitted by the capacitive coupling to the amplitude spectral density of the response voltage is eliminated.

According to an embodiment, the voltage pulse has the shape of a cardinal sine function modulated by a sine function.

According to an embodiment, the cardinal sine function has a spectral width, where the sine function has a modulation frequency equal to the spectral width of the cardinal sine function, where the first sinusoidal voltage has a first frequency and the second sinusoidal voltage has a second frequency equal to the sum of the first frequency and the spectral width of the cardinal sine function. One advantage is that a continuous reconstituted spectral density is obtained.

According to an embodiment, the spectral width of the cardinal sine function is equal to one quarter of the width of the search zone, the median frequency being equal to half the sum of the first frequency and the second frequency.

In a known manner, the spectral width can be seen as the cut-off frequency of a 3 dB filter.

A second aspect of the invention concerns a computer program product including instructions to implement the method according to the first aspect of the invention, when these instructions are executed by a processor.

BRIEF DESCRIPTION OF THE FIGURES

The invention and its various applications will be better understood on reading the description which follows, and on examining the figures which accompany it, which include.

Figure 1:
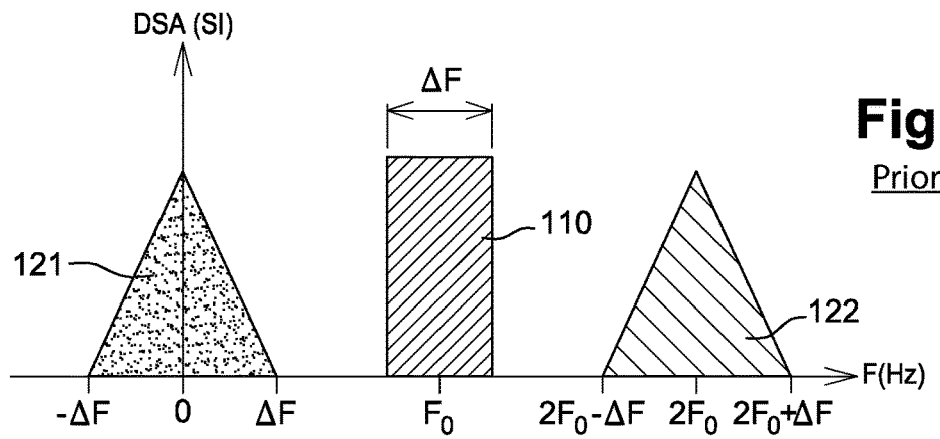
FIG. 1 represents schematically the amplitude spectral density of an excitation voltage applied at the input of an oscillator and the amplitude spectral density of the electrostatic force resulting therefrom, in the case of a measurement by narrowband pulse according to the prior art.

The figures are given for information only and are not restrictive of the invention in any manner.

For greater clarity, identical or similar elements are identified by identical reference signs in all the figures.

DETAILED DESCRIPTION OF EMBODIMENTS OF THE INVENTION

An oscillator of the MEMS or NEMS type includes a stationary part and a mobile component which moves relative to the stationary part. The oscillator also includes an input and an output between which the mobile component is positioned.

The oscillator's input is fitted with electrostatic actuation means configured so as to cause the mobile component to vibrate. The actuation means transform an electrical input signal, also called an "excitation signal", applied at the input of the oscillator, into an electrostatic actuation force, also called an "excitation force", acting on the mobile component. The excitation signal takes the form, for example, of a voltage. The excitation force drives the oscillatory movements of the mobile component. The actuation means include, for example, a first stationary electrode belonging to the stationary part and a first mobile electrode belonging to the mobile component. Each of these electrodes can be shaped like a comb, and jointly form an interdigital capacitive comb structure.

The oscillator's output is fitted with means for detecting movements of the mobile component. The detection means are configured to deliver an electrical output signal, also called a "response signal", which depends on the detected movements of the mobile component. For example, the detection means are of the capacitive type, and include means for measuring capacity between a second stationary electrode belonging to the stationary part and a second mobile electrode belonging to the mobile component. Each of these electrodes can be shaped like a comb, and jointly form an interdigital capacitive comb structure.

The oscillator is characterised by a resonant frequency and a quality factor. Both these parameters are essential to validate the design of the oscillator, and in order for it to be incorporated in a device such as an inertial sensor, for example an accelerometer or a gyroscope.

When the oscillator is excited at the resonant frequency the amplitude of the oscillations of the mobile component is at its maximum. When the excitation signal is no longer applied the oscillations of the mobile component are damped until the mobile component returns to an idle position in which the mobile component ceases to move. Damping over period t of the oscillations depends on an exponential term $$e^{-\frac{t}{2\tau}},$$

where $\tau$ is a damping constant, or relaxation time, defining the speed with which the amplitude of the oscillations decreases after excitation.

Quality factor Q of the oscillator is defined by the following relationship:

$$Q = \pi \cdot F_R \cdot T$$

where $F_R$ is the oscillator's resonant frequency. The quality factor reflects, in particular, the accuracy of the sensor in which the oscillator is incorporated. The higher the quality factor the greater the accuracy.

The main purpose of the present invention is to propose a method for determining the oscillator's characteristic parameters, where this method is both fast and reliable. The method according to the invention seeks in particular to determine the oscillator's resonant frequency and quality factor. In this method the oscillator is excited by an excitation voltage which results from the sum of a sinusoidal voltage and a voltage pulse.

A first embodiment of the method according to the invention will now be described, with reference to FIGS. 3 to 5. The method includes a step of generation of the excitation voltage. The excitation voltage is, for example, provided by a signal generator electrically connected to the oscillator's input. According to the first embodiment, the excitation voltage is the sum of a sinusoidal voltage of constant frequency $F_0$ and of a finite pulse response of a low-pass filter. The pulse response preferably has the shape of a cardinal sine function of spectral width $\Delta F$, where excitation voltage u(t) can then be defined by the following equation:

$$u(t) = A \cdot \text{sinc}(\Delta F \cdot t) + B \cdot \sin(2 \cdot \pi \cdot F_0 \cdot t) \quad (3)$$

where A and B are the amplitude, respectively, of the cardinal sine and of the sinusoidal voltage.

Alternatively, the pulse response can be that of any type of low-pass filter, such as a Hamming, Hanning, Chebyshev, Bartlett, or Blackman window.

Figure 3:
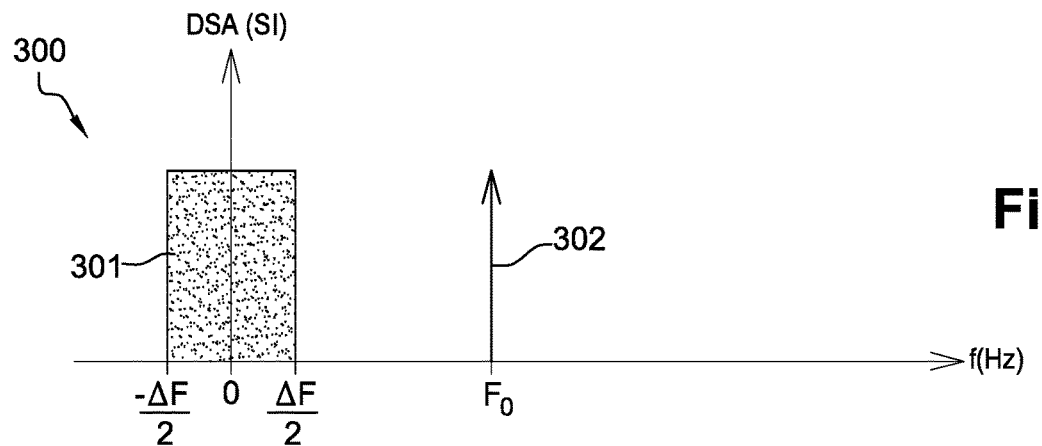
FIG. 3 represents schematically the amplitude spectral density of an excitation voltage applied at the input of an oscillator, according to a first embodiment of the method of the invention.

FIG. 3 represents schematically the amplitude spectral density 300 of the excitation voltage u(t), for example calculated by means of a Fourier transform. An amplitude spectral density (DSA) is expressed in units per square root of Hertz, i.e. in volts by square root of Hertz ($V \cdot Hz^{-0.5}$) when it concerns the amplitude spectral density of an excitation voltage, and in Newtons per square root of Hertz ($N \cdot Hz^{-0.5}$) when it concerns the amplitude spectral density of an excitation force.

The amplitude spectral density 300 of the excitation voltage includes:
  a first component 301 corresponding to the spectral density of the cardinal sine, where first component 301 is a rectangle function centred on 0 Hz, of spectral width $\Delta F$;
  a second component 302 corresponding to the spectral density of the sinusoidal voltage, where the second component 302 is a Dirac peak located at frequency $F_0$.

The excitation voltage is applied at the oscillator's input to cause it to oscillate. The resultant excitation force is proportional to the square of the excitation voltage. Excitation force F(t) can thus be expressed by the following equation:

$$F(t) = k\left[A \cdot \text{sinc}^2(\Delta F \cdot t) + \frac{B^2}{2} - \frac{B^2}{2} \cdot \cos(4 \cdot \pi \cdot F_0 \cdot t) + 2 \cdot A \cdot B \cdot \text{sinc}(\Delta F \cdot t) \cdot \sin(2 \cdot \pi \cdot F_0 \cdot t)\right] \quad (4)$$

where k is a proportionality coefficient. The excitation force is therefore the sum of a first term proportional to the square of the cardinal sine, of a second term equal to a constant, of a third term proportional to a sinusoidal function of frequency $2F_0$, and of a fourth term proportional to the cardinal sine modulated at frequency $F_0$.

Figure 4:
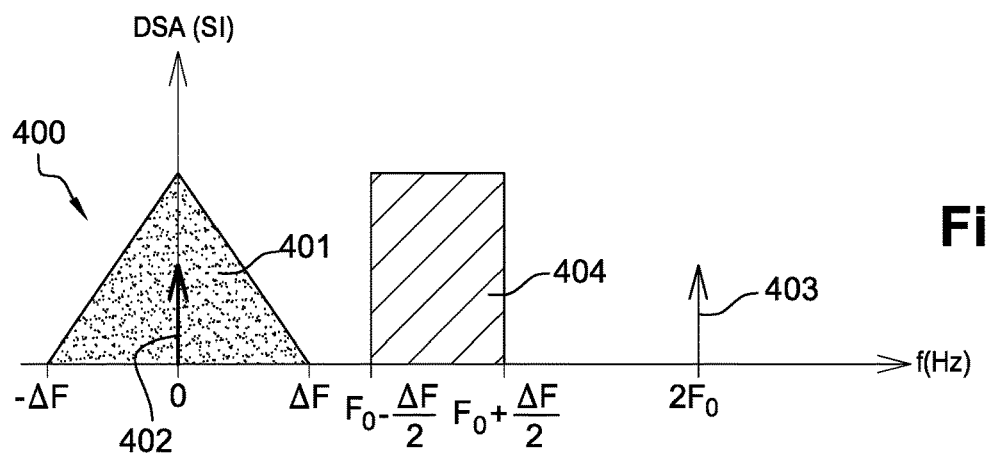
FIG. 4 represents schematically the amplitude spectral density of the excitation force produced by the excitation voltage of FIG. 3.

FIG. 4 represents schematically amplitude spectral density 400 of the excitation force F(t) obtained by transformation in the frequency domain, for example by means of a Fourier transform. Amplitude spectral density 400 includes:
  a first component 401 corresponding to the amplitude spectral density of the first term of equation (4), where the first component 401 has a triangular shape centred on 0 Hz, of spectral width $2\Delta F$;
  a second component 402 corresponding to the amplitude spectral density of the second term of equation (4), where the second component 402 is a Dirac peak located at 0 Hz;
  a third component 403 corresponding to the amplitude spectral density of the third term of equation (4), where the third component 403 is a Dirac peak located at frequency $2F_0$;
  a fourth component 404 corresponding to the amplitude spectral density of the fourth term of equation (4), where the fourth component 404 is a rectangle function centred on frequency $F_0$, of spectral width $\Delta F$.

The resonant frequency of the oscillator is sought in the frequency range called the "search zone", defined by the frequency $F_0$ of the sinusoidal voltage, and by the spectral width $\Delta F$ of the cardinal sine function. The search zone extends between a minimum frequency equal to $$F_0 - \frac{\Delta F}{2}$$

and a maximum frequency equal to $$F_0 + \frac{\Delta F}{2}.$$

Initially, it is possible to estimate the oscillator's resonant frequency, in particular on the basis of its design. The frequency $F_0$ of the sinusoidal voltage can then be defined such that the estimated resonant frequency is in the search zone, and in particular such that the search zone is centred on the estimated resonant frequency. Similarly, spectral width $\Delta F$ of the cardinal sine function can be defined to adjust the width of the search zone.

The excitation voltage applied at the oscillator's input is transmitted to the oscillator's output by capacitive coupling due to a parasitic capacity present between the oscillator's input and output. Spectral width ΔF of the pulse response is preferably less than F0-ΔF/2, so as to prevent this parasitic signal, which is of higher amplitude, overlapping the signal caused by the resonance.

When the excitation voltage is applied to the oscillator a step of acquisition then follows in the time domain of the oscillator's response signal provided by the detection means. To accomplish this acquisition means are electrically connected to the oscillator's output. The acquisition means can be an electronic acquisition card or a digital oscilloscope. The response signal takes the form, for example, of a voltage.

The acquisition is made with a sampling frequency configured to comply with the Shannon criterion. In this case, the sampling frequency depends on frequency $F_0$ of the sinusoidal voltage and spectral width ΔF of the pulse response, where sampling frequency $F_e$ must satisfy the following inequality:

$$F_e \geq 2 \cdot \left(F_0 + \frac{\Delta F}{2}\right)$$

The acquired response voltage is then transformed in the frequency domain to obtain its amplitude spectral density. The amplitude spectral density of the response voltage is, for example, calculated by means of a Fourier transform. From this amplitude spectral density it is possible to determine the oscillator's resonant frequency and quality factor.

Figure 5:
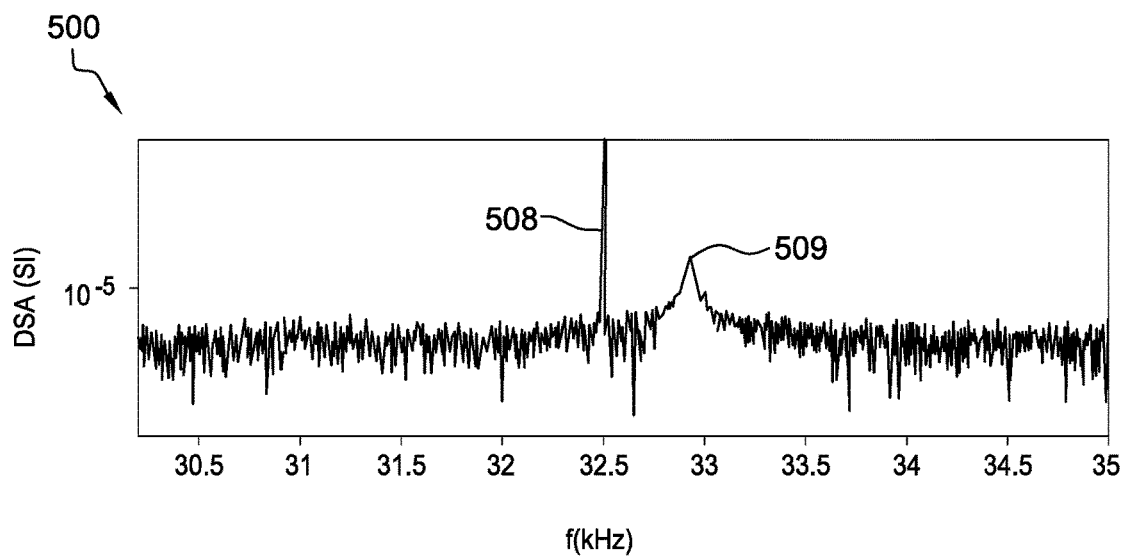
FIG. 5 is an example of an amplitude spectral density of the response signal of an oscillator of a gyroscope, obtained with the first implementation of the method of the invention.

FIG. 5 shows an example of amplitude spectral density 500 of the response voltage of an oscillator of a gyroscope, obtained by virtue of the first embodiment which has just been described. In this case frequency $F_0$ of the sinusoidal voltage is equal to 32.5 kHz and spectral width ΔF of the cardinal sine is equal to 5 kHz. The resonant frequency search zone thus covers the range 30 kHz to 35 kHz. FIG. 5 shows a resonance peak 509 at resonant frequency $F_R$ approximately equal to 32.9 kHz.

When the resonant frequency is known the quality factor can be determined by a measurement of the logarithmic decrement, which consists in measuring the damping time after the oscillator has been excited by a sinusoidal voltage at the resonant frequency. The quality factor can also be determined by calculating the ratio of the resonant frequency to the width of resonance peak 509 measured at half its height.

The excitation voltage applied at the oscillator's input is transmitted to the oscillator's output by capacitive coupling. One disadvantage of this first embodiment is that the Dirac peak 302 belonging to the amplitude spectral density 300 of the excitation voltage is located in the resonant frequency search zone, since this peak 302 is indeed present at frequency $F_0$. This is a minor disadvantage, since this Dirac peak 302 has a small spectral width, less than several tenths of a Hertz, whereas the search zone extends over a width which is preferably greater than 1 kHz. The capacitive coupling phenomenon is visible in FIG. 5 in the form of an amplitude peak 508 present at frequency $F_0$; in this case equal to 32.5 kHz.

However, a second embodiment of the method of the invention enables this disadvantage to be overcome. According to this second embodiment of the voltage pulse used to form the excitation voltage is no longer a pulse response of a low-pass filter, but that of a band-pass filter. This pulse response preferably has the shape of a cardinal sine function of spectral width ΔF modulated by a sine function of modulation frequency ΔF'.

According to this second embodiment, a first excitation voltage and a second excitation voltage are generated by adding the voltage pulse respectively to a first sinusoidal voltage having first frequency $F_1$, and to a second sinusoidal voltage having a second frequency $F_2$. The first sinusoidal voltage and the second sinusoidal voltage preferably have the same amplitude, such that excitation forces with the same amplitude are obtained. The first excitation voltage $u_1(t)$ and the second excitation voltage $u_2(t)$ can be defined by the following equations:

$$u_1(t) = A \cdot \text{sinc}(\Delta F \cdot t)\sin(2 \cdot \pi \Delta F' \cdot t) + B \cdot \sin(2 \cdot \pi \cdot F_1 \cdot t) \quad (6.1)$$

$$u_2(t) = A \cdot \text{sinc}(\Delta F \cdot t)\sin(2 \cdot \pi \Delta F' \cdot t) + B \cdot \sin(2 \cdot \pi \cdot F_2 \cdot t) \quad (6.2)$$

where A is the amplitude of the cardinal sine and B is the amplitude of the sinusoidal voltages.

Figure 6:
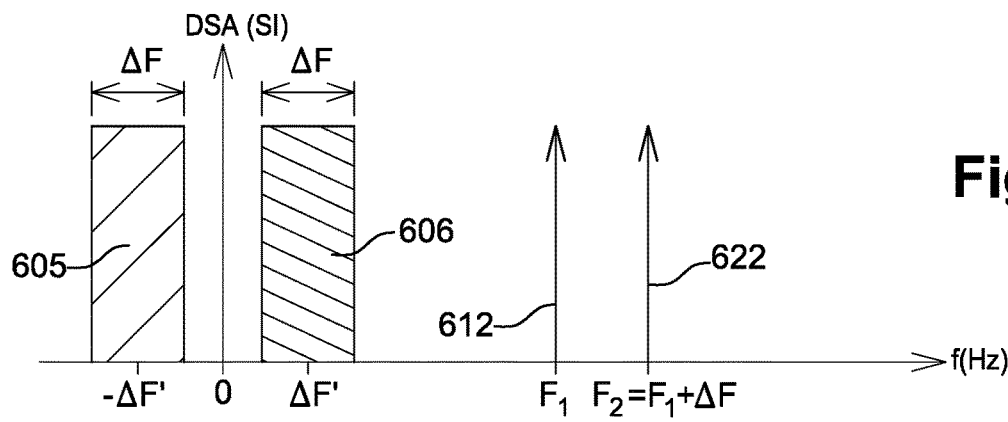
FIG. 6 represents schematically the amplitude spectral densities of a first excitation voltage and of a second excitation voltage, according to a second implementation of the method of the invention.

FIG. 6 represents schematically the amplitude spectral densities of first excitation voltage $u_1(t)$ and of first excitation voltage $u_2(t)$, for example calculated using a Fourier transform. These spectral densities each include:
- two first components 605, 606 corresponding to the amplitude spectral density of the cardinal sine modulated at frequency ΔF', these components 605, 606 are rectangle functions of spectral width ΔF centred respectively on −ΔF' and on +ΔF';
- a second component 612, 622 corresponding respectively to the amplitude spectral density of the first sinusoidal voltage and to the amplitude spectral density of the second sinusoidal voltage, where second component 612, 622 is a Dirac peak located at frequency $F_1$ in the case of the first excitation voltage, and at frequency $F_2$ in the case of the second excitation voltage.

The first excitation voltage and the second excitation voltage are applied successively at the oscillator's input. This then produces, respectively, a first excitation force $F_1(t)$ and a second excitation force $F_2(t)$ which are exerted successively on the oscillator's mobile component, and which can be expressed by the following equations:

$$F_1(t) = k\left[A^2 \cdot \text{sinc}^2(\Delta F \cdot t) \cdot \left(\frac{1 - \cos(4 \cdot \pi \cdot F_1 \cdot t)}{2}\right) + \frac{B^2}{2} - \frac{B^2}{2} \cdot \cos(4 \cdot \pi \cdot F_1 \cdot t) + 2 \cdot A \cdot B \cdot \text{sinc}(\Delta F \cdot t) \cdot \sin(2 \cdot \pi \cdot \Delta F' \cdot t) \cdot \sin(2 \cdot \pi \cdot F_1 \cdot t)\right] \quad (7.1)$$

$$F_2(t) = k\left[A^2 \cdot \text{sinc}^2(\Delta F \cdot t) \cdot \left(\frac{1 - \cos(4 \cdot \pi \cdot F_2 \cdot t)}{2}\right) + \frac{B^2}{2} - \frac{B^2}{2} \cdot \cos(4 \cdot \pi \cdot F_2 \cdot t) + 2 \cdot A \cdot B \cdot \text{sinc}(\Delta F \cdot t) \cdot \sin(2 \cdot \pi \cdot \Delta F' \cdot t) \cdot \sin(2 \cdot \pi \cdot F_2 \cdot t)\right] \quad (7.2)$$

where k is a proportionality coefficient. These equations which express the excitation forces each include a final term proportional to the product of the voltage pulse and the sinusoidal voltage.

Figure 7:
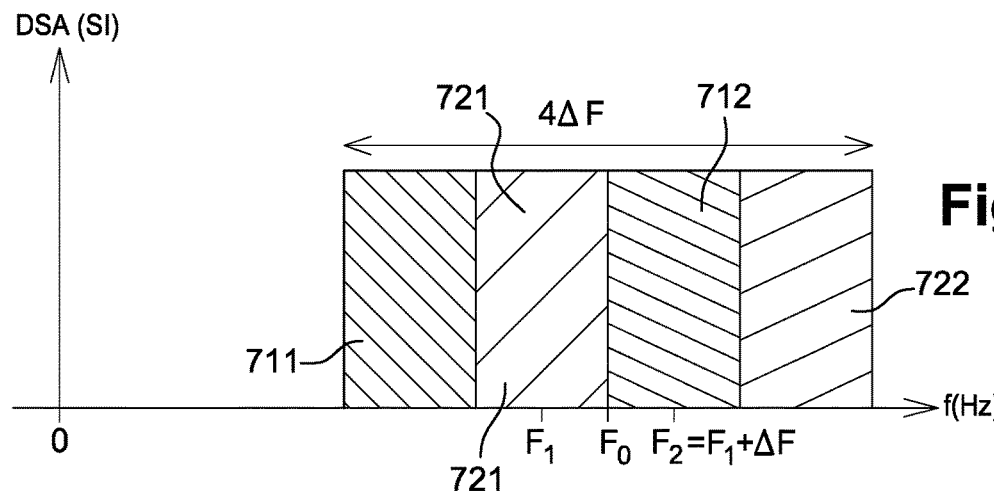
FIG. 7 represents schematically the amplitude spectral densities of the excitation force produced by each of the excitation voltages of FIG. 6.

FIG. 7 represents schematically and partially a superimposition of the amplitude spectral densities of the first excitation force $F_1(t)$ and of the second excitation force $F_2(t)$. FIG. 7 shows only the spectral components from which the resonant frequency search zone is reconstituted. The amplitude spectral density of the first excitation force includes two components 711, 712 corresponding to the amplitude spectral density of the final term of the equation (7.1), where these components 711, 712 are rectangle functions of spectral width $\Delta F$ centred respectively on frequencies $F_1-\Delta F'$ and on $F_1+\Delta F'$. Similarly, the amplitude spectral density of the second excitation force includes two components 721, 722 corresponding to the amplitude spectral density of the final term of the equation (7.2), where these components 721, 722 are rectangle functions of spectral width $\Delta F$ centred respectively on frequencies $F_2-\Delta F'$ and on $F_2+\Delta F'$.

The search zone obtained in this manner is centred on a median frequency $F_0$ equal to half the sum of the first frequency and of the second frequency $$\left(F_0 = \frac{F_1 + F_2}{2}\right).$$

Advantageously, modulation frequency $\Delta F'$ of the sine function is equal to spectral width $\Delta F$ of the cardinal sine function ($\Delta F'=\Delta F$), and second frequency $F_2$ is equal to the sum of first frequency $F_1$ and of spectral width $\Delta F$ ($F_2=F_1+\Delta F$). The search zone is thus continuous, and has a width equal to four times spectral width $\Delta F$.

If the modulation frequency $\Delta F'$ of the sine function is less than the spectral width $\Delta F$ of the cardinal sine function ($\Delta F'<\Delta F$) and/or if the second frequency $F_2$ is less than the sum of the first frequency $F_1$ and of the spectral width $\Delta F$ ($F_2<F_1+\Delta F$), the spectral components overlap. In this case there is unnecessary redundancy of information in the overlapping area.

On the contrary, if the modulation frequency $\Delta F'$ of the sine function is higher than the spectral width $\Delta F$ of the cardinal sine function ($\Delta F'>\Delta F$) and/or if the second frequency $F_2$ is higher than the sum of the first frequency $F_1$ and of the spectral width $\Delta F$ ($F_2>F_1+\Delta F$), the reconstituted spectral density is no longer continuous and is therefore null in certain frequency bands, which can result in the resonant frequency being missed.

According to the second embodiment the method includes a first step of acquisition in the time domain of a first response voltage present at the oscillator's output when the first excitation voltage is applied at the oscillator's input, and a second acquisition step in the time domain of a second response voltage present at the oscillator's output when the second excitation voltage is applied at the oscillator's input. In order to achieve the same resolution from one acquisition to the next the acquisition steps are preferably made with the same sampling frequency $F_e$, such that:

$$F_e \geq 2 \cdot (F_0+2 \cdot \Delta F)$$

The first response voltage and the second response voltage are transformed in the frequency domain to obtain, respectively, a first amplitude spectral density and a second amplitude spectral density. These amplitude spectral densities are, for example, calculated by means of a Fourier transform.

The first spectral density and the second spectral density are filtered in order to keep only the portions of spectrum corresponding to the spectral components represented in FIGS. 7A and 7B. This may use, for example, a digital filtering technique. An amplitude spectral density is then reconstituted by superimposing the retained portions of spectrum. The Dirac peaks present at frequencies $F_1$ and $F_2$, which are due to the capacitive coupling, are thus eliminated from the reconstituted amplitude spectral density. The reconstituted amplitude spectral density is equivalent to the one which would be obtained with an electrostatic force which was not disrupted by the capacitive coupling.

Figure 8:
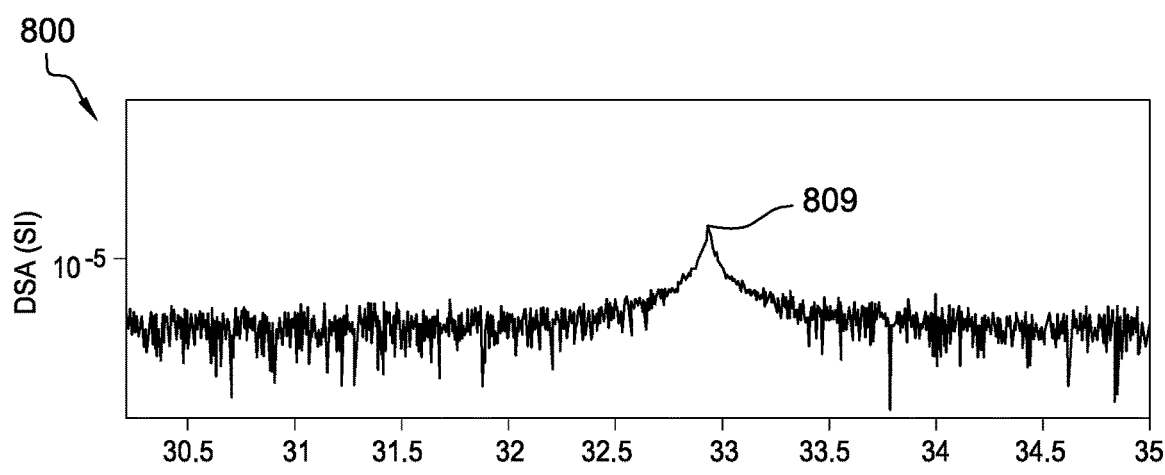
FIG. 8 is an example of an amplitude spectral density of the response signal of the oscillator of FIG. 5, obtained with the second implementation of the method of the invention.

FIG. 8 shows an example of the amplitude spectral density 800 of the response voltage of the same oscillator as in FIG. 5, obtained by virtue of the second embodiment which has just been described. In this case, the median frequency $F_0$ of the search zone is equal to 32.5 kHz. Spectral width $\Delta F$ of the cardinal sine function and the modulation frequency $\Delta F'$ of the sine function are equal to 1.25 kHz. The first frequency $F_1$ is consequently equal to 31.875 kHz and the second frequency $F_2$ is equal to 33.125 kHz. The resonant frequency search zone thus covers the 30 kHz to 35 kHz range. A resonance peak 809 is still present at resonant frequency $F_R$ approximately equal to 32.9 kHz. Conversely, the Dirac peaks 612, 622 belonging to the amplitude spectral densities 610, 620 of the first excitation voltage and of the second excitation voltage are well absent.

Figure 9A:
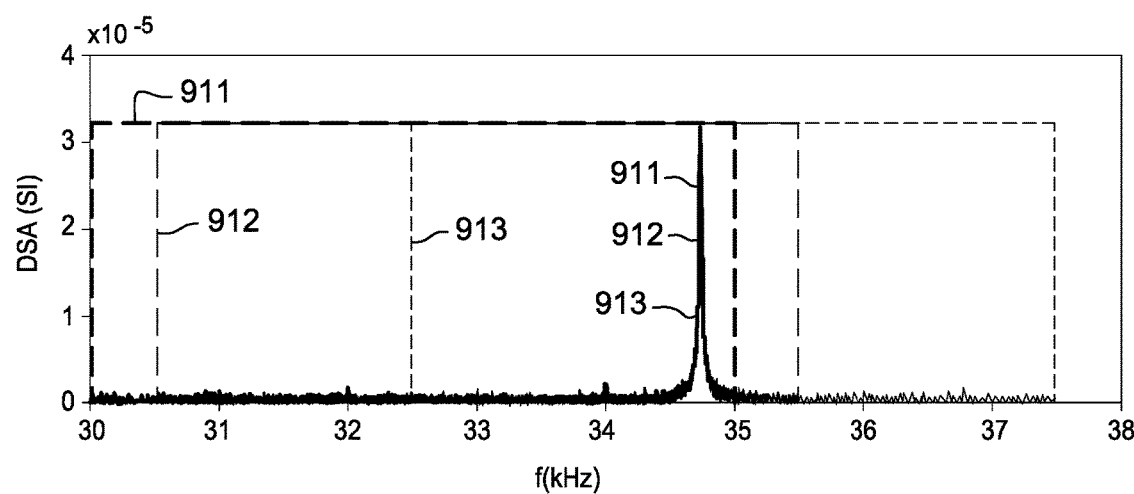
FIG. 9A represents schematically three amplitude spectral densities of the electrostatic force acting on the oscillator of FIG. 2A, together with the three amplitude spectral densities of the corresponding response voltage, according to the second implementation of the method of the invention.

FIG. 9A shows three examples of amplitude spectral densities 911, 912, 913 of an excitation force formed according to the second embodiment. The median frequency $F_0$ of the search zone defined by these spectral densities 911, 912, 913 is respectively equal, respectively, to 32.5 kHz, 33 kHz and 34 kHz. To each of these spectra 911, 912, 913 corresponds a reconstituted amplitude spectral density 921, 922, 923 of the oscillator's response voltage.

Figure 2A:
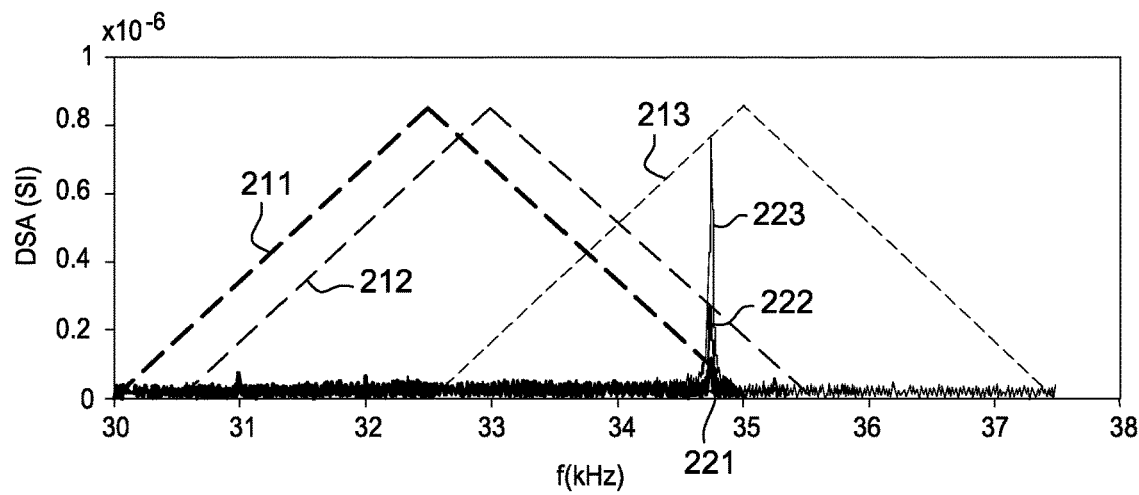
FIG. 2A represents schematically three amplitude spectral densities of the electrostatic force acting on an oscillator excited by means of a cardinal sine modulated by a sine function, together with the three amplitude spectral densities of the corresponding response voltage.
Figure 2B:
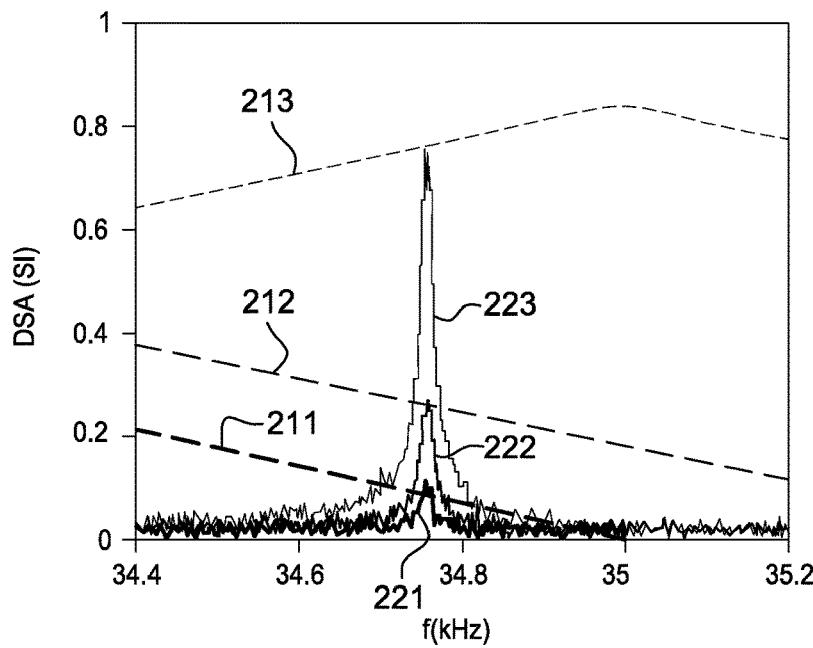
FIG. 2B is an enlarged view of FIG. 2A around the resonance peaks.
Figure 9B:
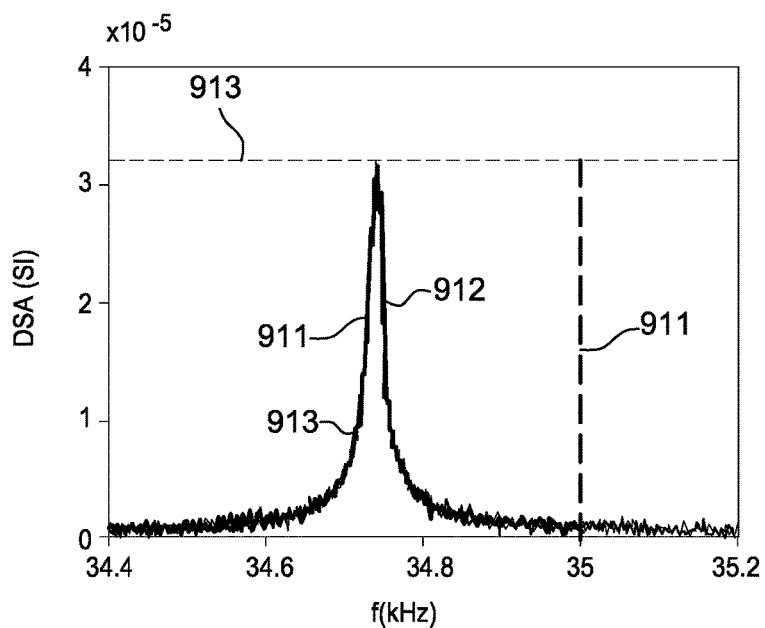
FIG. 9B is an enlarged view of FIG. 9A around the resonance peaks.

Thanks to the use of the sum of the cardinal sine and of the sinusoidal voltage as the excitation voltage, the amplitude of spectral densities 911, 912, 913 is constant across the entire search zone. Consequently, the reconstituted spectral densities 921, 922, 923 each includes a resonance peak with the same amplitude, as can be seen more clearly in FIG. 9B. The amplitude of the peak does not therefore depend on its position relative to the edges of the search zone, unlike in the case of the prior art illustrated in FIGS. 2A and 2B.

Figure 10:
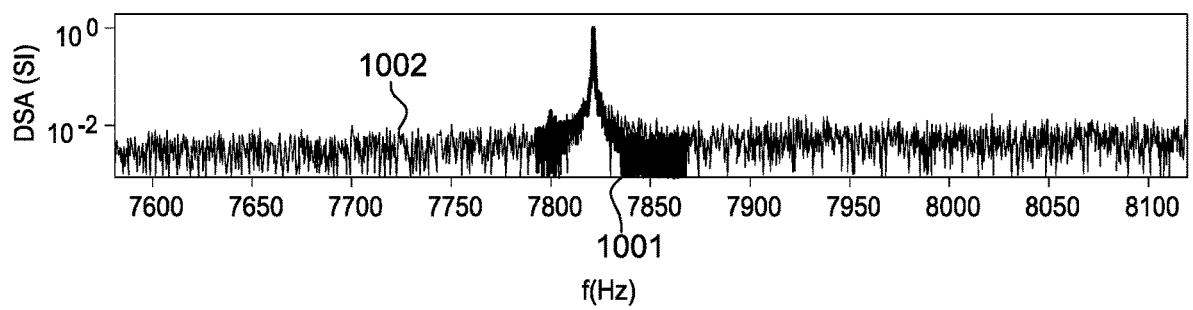
FIG. 10 illustrates a comparison between a measurement by frequency sweep according to the prior art and a measurement according to the method of the invention.

FIG. 10 shows an amplitude spectral density 1001 of the response voltage of an oscillator obtained by the frequency sweep method of the prior art. In this case the measurement lasted for approximately 81 minutes with a frequency range of 75 Hz and a frequency interval of 0.02 Hz. FIG. 10 also shows, for the same oscillator, an amplitude spectral density 1002 of the response voltage obtained by the method of the invention. In this case the measurement lasted for approximately 40 seconds with a frequency range of 500 Hz and a frequency interval of 0.25 Hz (this curve 1002 is in fact the result of the average of 10 curves, each corresponding to an acquisition time of 4 s at the sampling frequency of 25 kHz; if the average of several acquisitions is calculated, noise is reduced). It is observed that the resonance peaks of the two amplitude spectral densities 1001, 1002 are superimposed; conversely the method of the invention enables the oscillator to be characterized much more rapidly.

The method according to the invention is, for example, implemented by means of an application. The term "application" refers to a computer program including instructions which can be executed by a processor.

The invention is of course not limited to the implementations described with reference to the figures, and variants could be considered without going beyond the scope of the invention.

The invention claimed is:

1. A method for determining characteristic parameters of an electrostatic actuation oscillator, where the characteristic parameters have a resonant frequency, the method comprising:

estimating the oscillator's resonant frequency;
defining a frequency range for a search zone, in which the resonant frequency is sought, wherein the search zone is centred on an estimated resonant frequency;
generating an excitation voltage defined as a sum of a sinusoidal voltage with a constant frequency equal to the estimated resonant frequency and a pulse response of a low-pass filter with a spectral width equal to a width of the search zone;
applying the excitation voltage at an input of the oscillator;
acquiring in the time domain a response voltage present at an output of the oscillator when the excitation voltage is applied at the input of the oscillator;
obtaining, by transformation in the frequency domain, an amplitude spectral density of the response voltage; and
determining the characteristic parameters of the oscillator from the amplitude spectral density.

2. The method according to claim 1, wherein the pulse response of the low-pass filter has the form of a cardinal sine function.

3. A method for determining characteristic parameters of an electrostatic actuation oscillator, where the characteristic parameters have a resonant frequency, the method comprising:
estimating the oscillator's resonant frequency;
defining a frequency range for a search zone in which the resonant frequency is sought, wherein the search zone is centred on an estimated resonant frequency;
generating a first excitation voltage defined as a sum:
of a sinusoidal voltage having a first constant frequency; and
of a pulse response of a band-pass filter having a spectral width equal to one quarter of a width of the search zone;
generating a second excitation voltage defined as a sum:
of a sinusoidal voltage having a second constant frequency such that the sum of the first frequency and the second frequency is equal to twice a median frequency on which the search zone is centred; and
of a pulse response of a band-pass filter having a spectral width equal to one quarter of the width of the search zone;
applying successively the first excitation voltage and the second excitation voltage at an oscillator's input;
acquiring in the time domain a first response voltage and a second response voltage present successively at an output of the oscillator when the first excitation voltage and the second excitation voltage are applied respectively at the input of the oscillator;
obtaining, by transformation in the frequency domain, a first amplitude spectral density of the first response voltage and a second amplitude spectral density of the second response voltage;
reconstituting an amplitude spectral density from the first amplitude spectral density and the second amplitude spectral density;
wherein the characteristic parameters of the oscillator are determined from the reconstituted amplitude spectral density.

4. The method according to claim 3, wherein a pulse response of the band-pass filter has the form of a cardinal sine function modulated by a sine function.

5. The method according to claim 4, wherein the sine function has a modulation frequency equal to the spectral width of the cardinal sine function, wherein the difference between the first frequency and the second frequency of the sinusoidal voltage is equal to the spectral width of the cardinal sine function, and wherein the reconstituted amplitude spectral density is continuous.

6. A non-transitory computer readable medium including instructions for implementing a method according to claim 1, when the instructions are executed by a processor.

* * * * *